United States Patent
Zortea

(10) Patent No.: US 7,982,651 B1
(45) Date of Patent: *Jul. 19, 2011

(54) POWER OPTIMIZED ADC FOR WIRELESS TRANSCEIVERS

(75) Inventor: Anthony Eugene Zortea, Pipersville, PA (US)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/748,754

(22) Filed: Mar. 29, 2010

Related U.S. Application Data

(63) Continuation of application No. 12/114,322, filed on May 2, 2008, now Pat. No. 7,760,122.

(51) Int. Cl.
*H03M 1/12* (2006.01)
(52) U.S. Cl. ........................ 341/155; 341/118
(58) Field of Classification Search .................. 341/155, 341/118, 120, 139
See application file for complete search history.

(56) References Cited

U.S. PATENT DOCUMENTS

| | | | |
|---|---|---|---|
| 6,340,944 B1 | 1/2002 | Chang et al. | |
| 6,473,016 B2 | 10/2002 | Piirainen et al. | |
| 7,016,654 B1 | 3/2006 | Bugeja | |
| 7,068,743 B1 | 6/2006 | Suzuki | |
| 7,499,462 B2 | 3/2009 | MacMullan et al. | |
| 7,522,885 B2 * | 4/2009 | Parssinen et al. | 455/67.11 |
| 2005/0163197 A1 | 7/2005 | Cleary et al. | |
| 2005/0208919 A1 | 9/2005 | Walker et al. | |
| 2008/0048903 A1 | 2/2008 | Kimura et al. | |
| 2008/0192640 A1 | 8/2008 | Simpson | |

OTHER PUBLICATIONS

USPTO; Office Action dated May 5, 2009, from related U.S. Appl. No. 12/114,322, filed May 2, 2008.
USPTO; Office Action dated Dec. 28, 2009, from related U.S. Appl. No. 12/114,322, filed May 2, 2008.

* cited by examiner

*Primary Examiner* — Peguy JeanPierre
(74) *Attorney, Agent, or Firm* — Knobbe Martens Olson & Bear LLP

(57) ABSTRACT

An analog-to-digital converter (ADC) of a radio receiver can consume a relatively large amount of power. It is typically desirable to minimize power consumption, particularly with battery-powered devices, such as in wireless receivers. In certain conditions, the effective number of bits (ENOB) required from an ADC of a receiver can vary. The power consumption of certain ADC topologies, such as pipelined converter topologies, can vary with the number of bits. One embodiment dynamically varies the ENOB of an ADC to more optimally consume power. This can extend battery life.

23 Claims, 16 Drawing Sheets

POWER OPTIMIZED ADC FOR WIRELESS TRANSCEIVERS

CROSS-REFERENCE TO RELATED APPLICATION

This application is a continuation application of U.S. application Ser. No. 12/114,322, filed May 2, 2008, issued as U.S. Pat. No. 7,760,122 on Jul. 20, 2010, the entirety of which is incorporated by reference herein.

BACKGROUND

1. Field of the Invention

The invention generally relates to electronics, and in particular, to a data communications receiver in which an analog-to-digital converter is present.

2. Description of the Related Art

Reducing power dissipation is important in nearly all data communication products, but it is especially important in a battery-powered wireless transceiver for the extension of operating time.

The radio frequency (RF) and analog portion of a wireless transceiver, typically referred to as the "radio," can be divided into a receiver (Rx) and a transmitter (Tx). The power dissipation of a typical receiver is shown in FIG. 1. As illustrated in FIG. 1, the analog-to-digital converter (ADC) is responsible for a relatively large amount of the receiver's power consumption. In the illustrated example, the ADC consumes about 27%. The local oscillator (LO) consumes about 24%, the analog baseband (aBB) consumes about 16%, the digital intermediate frequency (D I/F) consumes about 12%, the low noise amplifier (LNA) consumes about 9%, and other circuits consume about 12%.

Co-existence of wireless communication links from different wireless standards, and a generally crowded wireless spectrum results in "interfering" radio signals near the frequency of a desired radio signal to be received, as illustrated in FIG. 9.

In an extreme case, the presence of a relatively large interferer near the desired signal makes reception of the desired signal impossible. Even in a relatively good case, the ability to handle a relatively large interferer increases the linearity and baseband filtering requirements of the radio, which in turn increases the radio's cost and power.

One conventional solution to the problem of a large interferer is to increase the linearity and increase the analog baseband requirements of the radio front end. This approach increases both the cost and the power used by the radio.

In another approach illustrated in FIG. 10, the interfering signal is separated at baseband, then up-converted to RF and subtracted from the total RF signal. See Aminghasem Safarian, et al., *Integrated Blocker Filtering RF Front Ends, Radio Frequency Integrated Circuits (RFIC) Symposium*, Jun. 3-5, 2007, 2007 Institute of Electrical and Electronics Engineers (IEEE), pp. 13-16.

SUMMARY OF THE DISCLOSURE

It is desirable to reduce power consumption in many devices, such as battery-operated devices. The analog-to-digital converter (ADC) of a radio receiver (which can be part of a transceiver) can consume a relatively large amount of power. In certain conditions, the effective number of bits (ENOB) required of the ADC of a receiver can vary. By adaptively varying the ENOB of an ADC based on operating conditions, the power consumption of the ADC can be reduced and battery life can be conserved.

An interference scanner can efficiently determine the presence and frequency of an interfering signal (interferer). An RF spectrum can be downconverted to baseband. During the downconversion, the interferer is also downconverted. Counts of run-lengths from the sign of a baseband signal can be analyzed to estimate a frequency (in baseband) of the interferer. For example, a peak occurrence run-length can be associated with a frequency. In one embodiment, counts of run-lengths are used to construct a theoretical peak occurrence run-length, which is then associated with a frequency for the interferer. A local oscillator frequency used for downconversion can then be used to map the frequency of the interferer back to radio frequency.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

Figure 1:
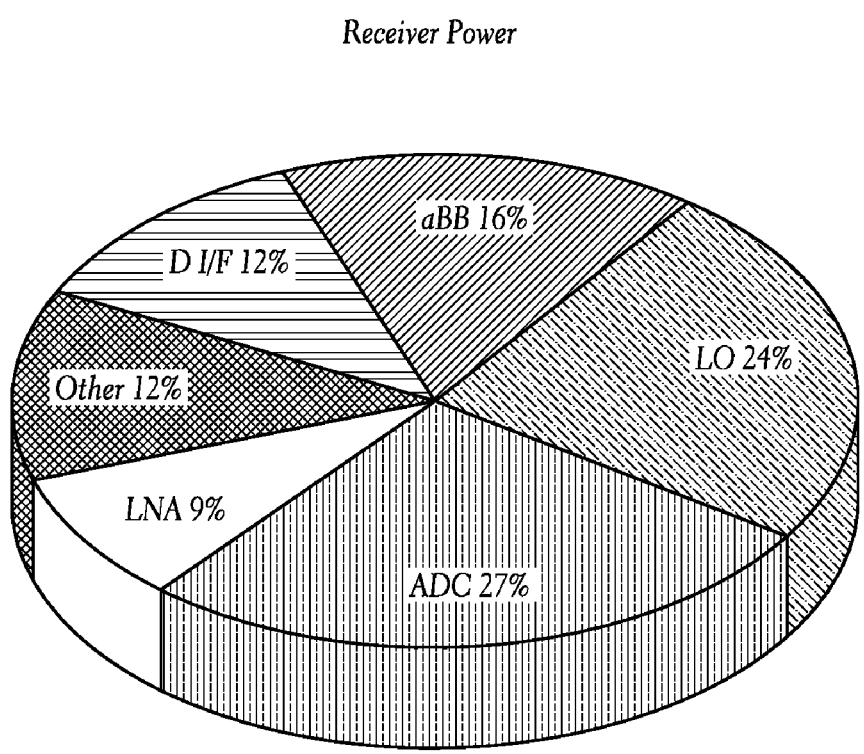
FIG. 1 illustrates a typical power consumption allocation for a receiver.

In the example illustrated in FIG. 1, an analog-to-digital converter (ADC) consumes more power than any other block in the receiver. One possibility is to take advantage of the Power-ENOB relationship shown below in FIG. 2.

Figure 2:
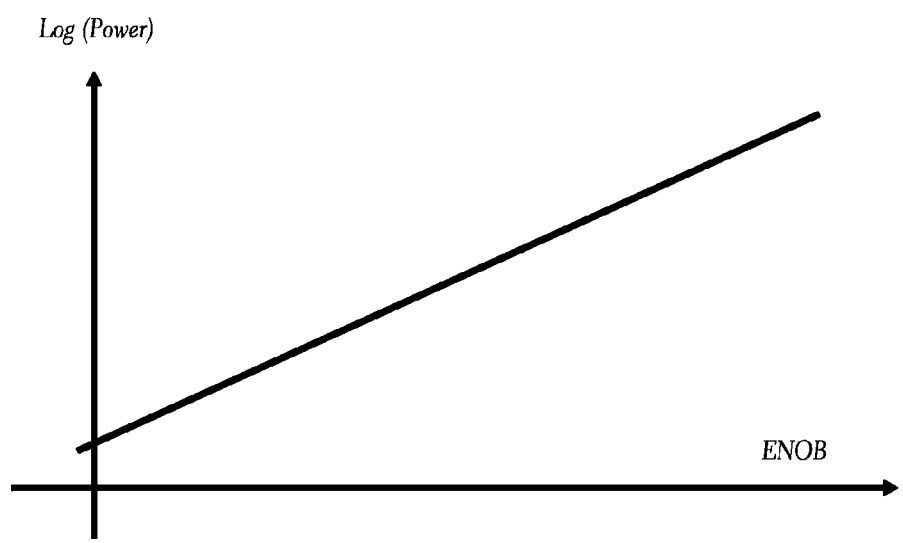
FIG. 2 illustrates an example of a relationship between power used by an analog-to-digital converter (ADC) and an effective number of bits (ENOB).

FIG. 2 illustrates an example of a relationship between power used by an analog-to-digital converter (ADC) and an effective number of bits (ENOB). As illustrated by FIG. 2, if there are states of the receiver that use a lower ENOB than the maximum available, then we can reduce the power used by the ADC for those states. One embodiment includes detection of those states for which power can be saved.

A minimum value for the effective number of bits (ENOB) can be calculated as follows.

The signal-to noise plus distortion ratio (SNDR) for the system $sndr_{system}$ is a function of the SNDR of the analog components $sndr_{RF+Baseband}$ and the SNDR of the analog-to-digital converter (ADC) $sndr_{ADC}$. Lower case variables herein indicate linear units, while upper case variables indicate decibels. Equation 1 expresses the cumulative effect of SNDR.

$$\frac{1}{sndr_{system}} = \frac{1}{sndr_{RF+Baseband}} + \frac{1}{sndr_{ADC}} \quad \text{(Eq. 1)}$$

The $sndr_{ADC}$ should be set above, but not too far above, the $sndr_{RF+Baseband}$ so that $sndr_{system}$ is dominated by $sndr_{RF+Baseband}$.

Equation 2 expresses the relationship between the effective number of bits (ENOB) and the SNDR for an ADC.

$$ENOB = \frac{SNDR + PAR - 4.77}{6.02} \quad \text{(Eq. 2)}$$

In Equation 2, the SNDR and PAR are in decibels. The PAR is the peak power to average power ratio of the ADC input signal, and SNDR is the signal to noise plus distortion ratio of the input signal. Equation 3 expresses the minimum amount of $SNDR_{ADC}$ needed to satisfy a particular specification.

$$SNDR_{ADC} > SNDR_{RF+Baseband} + PAR + IDR_{Wasted} \quad \text{(Eq. 3)}$$

In Equation 3, $IDR_{Wasted}$ is the wasted input dynamic range, in dB (for example, if the maximum input range were 1V, and the actual input signal range were 0.5V, then $IDR_{Wasted}$=6 dB).

Equation 4 expresses a practical design rule based on Equation 3.

$$SNDR_{ADC} = SNDR_{RF+Baseband} + PAR + IDR_{Wasted} + \text{MARGIN} \quad \text{(Eq. 4)}$$

In an example of a specification for a WiMAX wireless receiver, the following conditions are assumed. Other applicable conditions will be readily determined by one of ordinary skill in the art.

0 dB<$SNDR_{RF+Baseband}$<35 dB
PAR=12 dB
0 dB<$IDR_{Wasted}$<10 dB
Margin=6 dB

The foregoing conditions are discussed in greater detail later. With the foregoing conditions applied, the $SNDR_{ADC}$ should be between 18 dB and 63 dB. The corresponding effective number of bits (ENOB) should be between about 3 bits and 9.5 bits.

In a conventional receiver of a wireless transceiver, an ADC is set to the maximum ENOB, such as 10, such that the ENOB is satisfactory under all conditions (between 3 and 9.5 in the example). When a lower ENOB can be used satisfactorily, power is wasted.

One embodiment of the invention estimates $SNDR_{RF+Baseband}$ and $IDR_{Wasted}$, and sets the effective number of bits (ENOB) of an ADC 402 (FIGS. 4, 6, 7, and 8) appropriately, thereby optimizing ADC power dissipation.

It is important to distinguish between the ADC input signal, and the Rx input signal; the latter referring to the input signal at the wireless transceiver antenna.

The analog input signal ADC input to the ADC 402 has the greatest range $SNDR_{RF+Baseband}$, and therefore, the greatest impact on the required ENOB for the ADC. This variation is the result of noise and nonlinearity in the channel and circuitry that precedes the ADC, as explained below.

Small Rx input signals will result in a low $SNDR_{RF+Baseband}$ at the input of the ADC due to the noise factor of the RF and Baseband amplifiers; and large interfering signals at the Rx input will result in low SNDR ADC input signals due to RF and Baseband amplifier nonlinearity.

Figure 3:
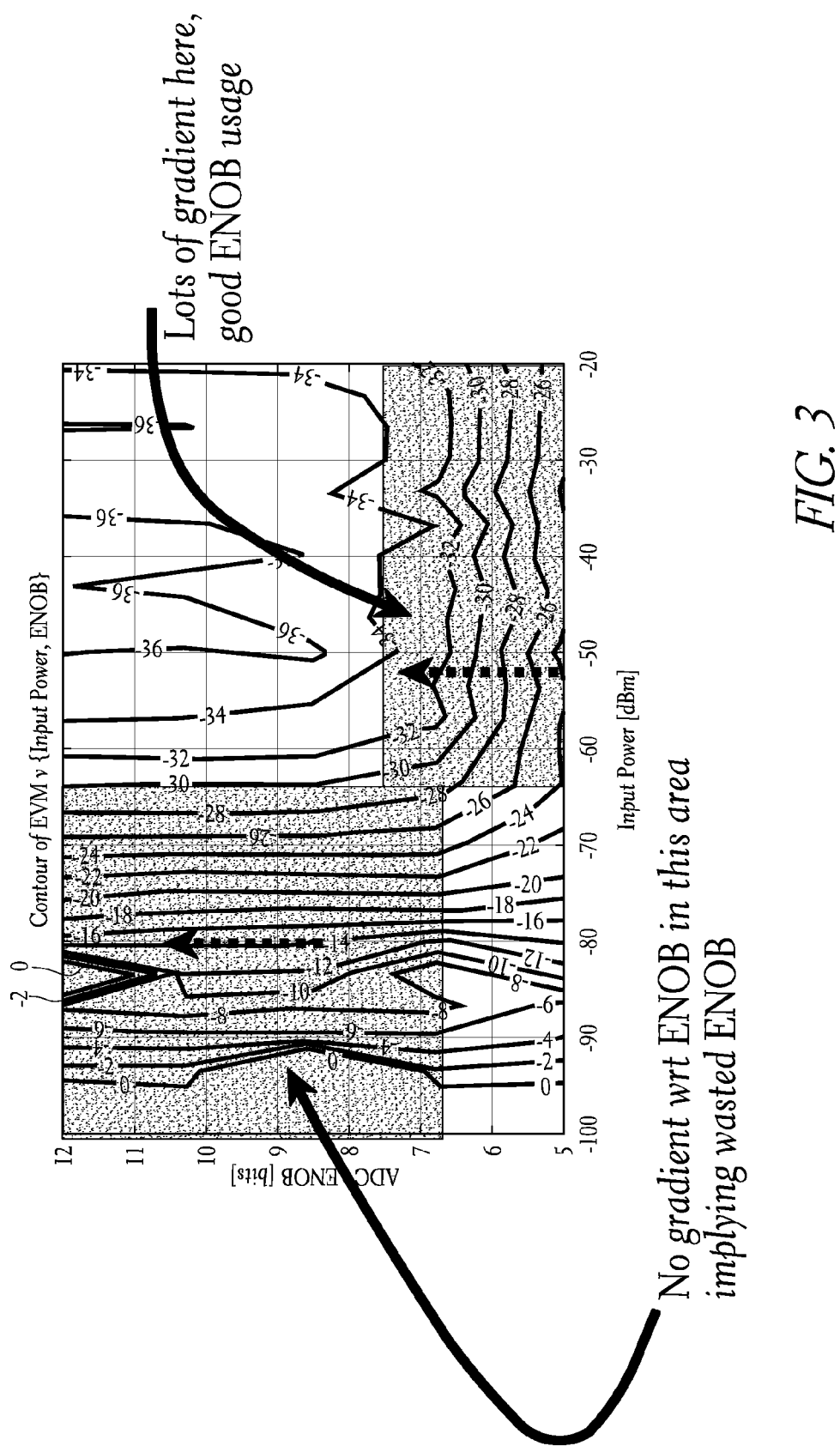
FIG. 3 is a contour graph that illustrates error vector magnitude (EVM) versus receiver input power level and an effective number of bits (ENOB) for an analog to digital converter (ADC).

FIG. 3 is a contour graph that illustrates error vector magnitude (EVM) versus receiver input Rx input power level and an effective number of bits (ENOB) for an analog-to-digital converter (ADC). The graph is drawn in the absence of interfering signals. The EVM is the arithmetic opposite of SNDR in decibels. Input power ranges along the horizontal axis. An effective number of bits (ENOB) for an analog-to-digital converter (ADC) ranges along the vertical axis, and the contour gives the EVM at each point in the {Input Power, ENOB} space.

FIG. 3 implies that lower Rx input signal levels can use a lower ENOB for the ADC, which would therefore consume lower ADC power. Therefore, if the Rx input signal level can be estimated, then the ENOB can be adjusted appropriately to save power. One convenient estimate of the Rx input signal level is the AGC control value from the baseband.

Figure 4:
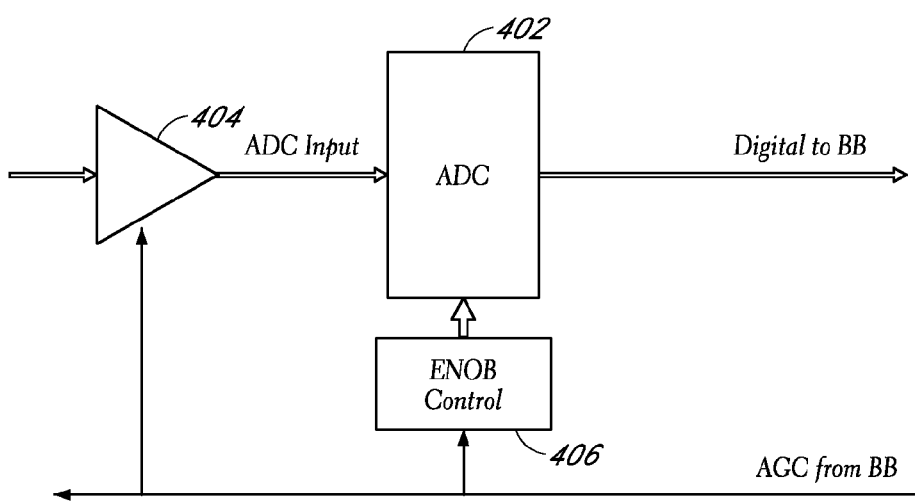
FIG. 4 illustrates an embodiment of the invention in which adjustment of an effective number of bits (ENOB) of an analog-to-digital converter (ADC) is based on an automatic gain control (AGC) signal from digital baseband (BB) circuits.

FIG. 4 illustrates an embodiment of the invention in which adjustment of an effective number of bits (ENOB) of an analog-to-digital converter (ADC) 402 is adjusted using an automatic gain control (AGC) signal from baseband (BB) circuits. FIG. 4 illustrates the ADC 402, a variable gain amplifier (VGA) 404, and an ENOB control 406. The VGA 404 is part of a receiver front-end, which can contain other components such as other variable gain amplifiers, low pass filters, low noise amplifiers, downconverters, etc. The illustrated embodiment is convenient as an AGC control signal is already present in typical receivers.

The ENOB control 406 converts the AGC control to a control for the number of bits of resolution of the ADC 402. A pipelined ADC architecture is typically used in a wireless receiver. With this pipelined ADC architecture, the settling-time of each switched-capacitor op-amp stage dominates the ENOB (for a given capacitor size), and the settling-time dominates the power dissipation. Settling-time depends on both the slew-rate limit and linear bandwidth of the ADC op-amps.

For example, the ENOB of the ADC 402 can be adjusted by an ENOB control 406, 602, 702, 802 (FIGS. 4, 6, 7, and 8) that is configured to adjust the settling-time of the ADC 402 via a bias current. This, in turn, adjusts the power consumed by the ADC 402. In this manner, the total current consumption of a switched-capacitor op-amp stage is varied with the bias current and settling time and ENOB with the desired relationship shown in FIG. 2.

In a pipelined ADC, the ENOB is not only dependent on the settling-time as described above, but also on the number of pipelined stages that are activated. When the full range of resolution of the ADC 402 is not needed, pipelined stages can be bypassed to save power. For examples of pipelined ADC topologies, see, for example, U.S. Pat. No. 6,340,944 to Change, et al., or U.S. Pat. No. 7,016,654 to Bugeja.

The technique illustrated in FIG. 4 is useful in the absence of interference. When interference levels are significant, further ENOB—and therefore power—reductions may be possible, as described later.

Figure 5:
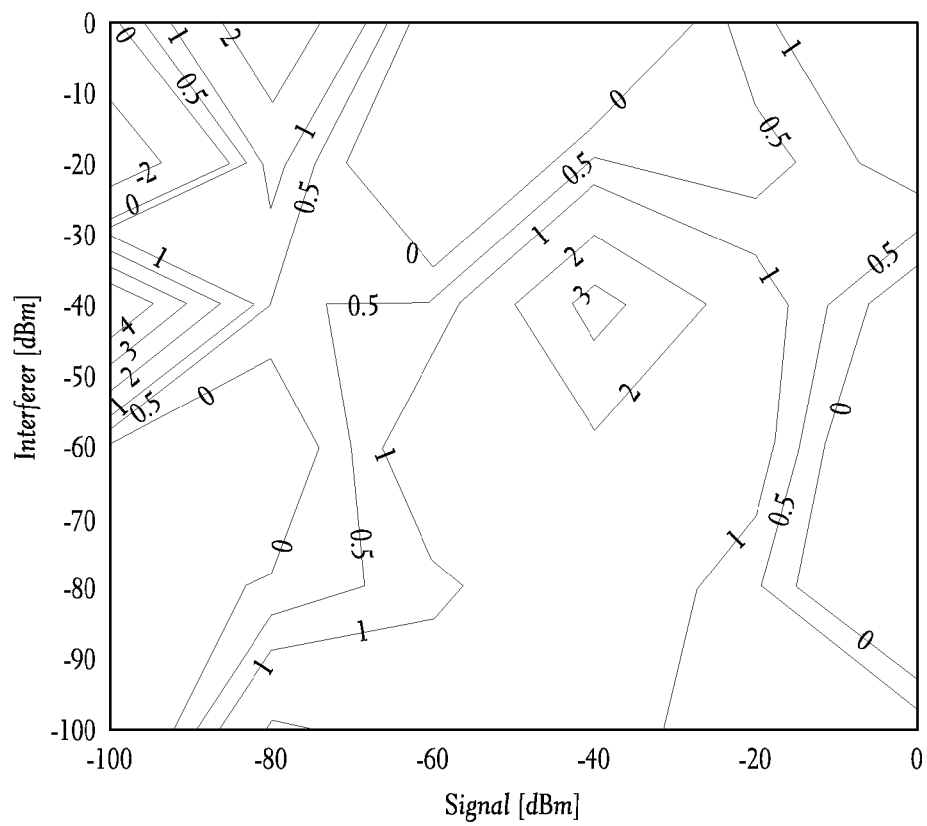
FIG. 5 is a contour graph that illustrates a change in error vector magnitude (EVM) versus input signal power and interferer power.

FIG. 5 is a contour graph that illustrates a change in error vector magnitude (EVM) versus input signal power and interferer power. FIG. 5 shows that the ENOB can be relaxed when a relatively strong interfering signal (interferer) is present. Input signal level ranges along the horizontal axis. Interferer power level ranges along the vertical axis.

FIG. 5 illustrates the difference in EVM for an ENOB of 9.2 and an ENOB of 7.2, over the 2-dimensional space of input signal power and interfering signal power. That is, a contour plot of EVM versus {Input Signal Power, Interfering Signal Power} is constructed using an ADC ENOB=9.2. Then, the EVM contour is found over the same 2-dimensional space, but with an ADC ENOB=7.2 used; and finally, difference in EVM for the 2 contours over the 2-dimensional space is represented in the graph of FIG. 5. The numbers within the graph indicate the difference in EVM in decibels.

At first, EVM variation in this space appear to be random, but a closer inspection reveals that for Rx input signal levels between −60 dBm and −20 dBm (horizontal axis); and interfering signal levels between −80 dBm and −30 dBm (vertical axis), the EVM advantage of the higher ENOB ADC is greater than 1 dB. Therefore, within this "box," an ENOB=9.2 can be used, and outside this box, a lower ENOB=7.2 can be used to save power.

Figure 6:
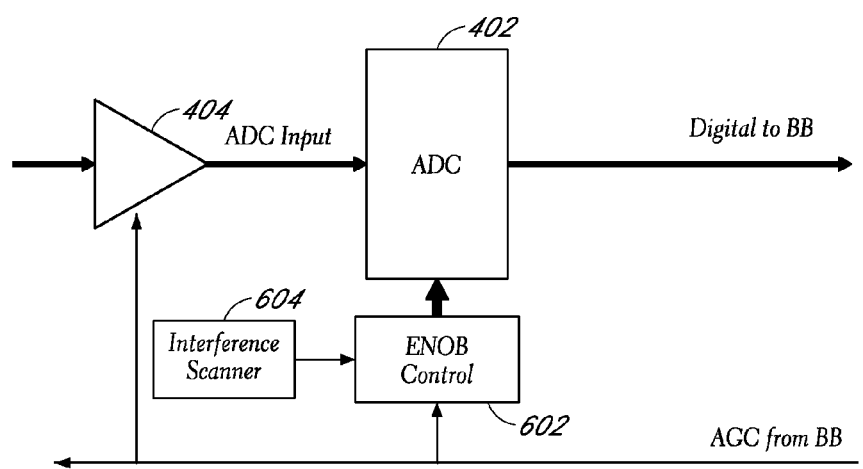
FIG. 6 illustrates an embodiment of the invention in which adjustment of an ENOB of an ADC is based on both input signal (RF) power and interfering signal power.

FIG. 6 illustrates an embodiment of the invention in which adjustment of the ENOB of the ADC 402 is based on both input signal power and interfering signal power. FIG. 6 illustrates the ADC 402, the VGA 404, an ENOB control 602, and an interference scanner 604. The ENOB control 602 uses a combination of the AGC control (AGC from the digital BB) and an input from the interference scanner 604 to determine an appropriate ENOB setting for the ADC 402.

In one embodiment, the interference scanner 604 corresponds to the interference scanner disclosed in commonly-owned U.S. patent application Ser. No. 12/055,948, filed Mar. 26, 2008, by Zortea, et al, the disclosure of which is incorporated by reference in its entirety, and is described in connection with FIGS. 9-16 herein. One embodiment of the interference scanner of U.S. patent application Ser. No. 12/055,948 determines the presence of interference by observing a plurality of consecutive ones or zeroes to tabulate run lengths of ones or zeroes from the samples, and collecting a frequency of occurrence distribution of the run-lengths observed.

Figure 7:
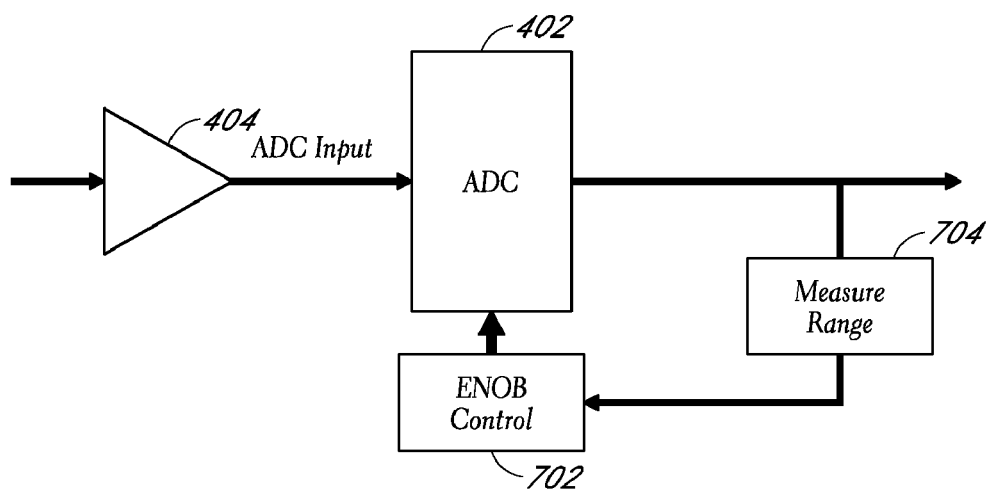
FIG. 7 illustrates an embodiment of the invention in which adjustment of an ENOB of an ADC is based on a signal level of the input to the ADC.

FIG. 7 illustrates an embodiment of the invention in which adjustment of the ENOB of the ADC 402 is based on the signal level of the input to the ADC 402. Ideally, an ADC input signal would match the input signal range of the ADC 402, but via AGC errors, residual DC offsets, and residual in-Nyquist-band interfering signals, a portion of the input signal range of the ADC 402 will typically be wasted ($IDR_{wasted}$ from Equation 3 and Equation 4). For a typical wireless receiver, 7-10 dB of range is typically allotted for these errors. The AGC error and DC offsets can vary over time, which implies that ENOB is wasted when the error is less than the allotted amount.

The illustrated embodiment of FIG. 7 has a range measurement circuit 704 and an ENOB control 702. The range measurement circuit 704 determines the input range used by the ADC 402. The ENOB control 702 reduces the ENOB of the ADC 402 when the range as indicated by the range measurement circuit 704 indicates that the AGC error and residual DC offset is less than the worst case allotted amount. When the output range of the ADC 402 is high, the ENOB of the ADC 402 approaches maximum ENOB, that is, approaches the total bits of the ADC 402. When the output range is relatively low, the ENOB of the ADC 402 is relatively lower. A system is typically designed so that it meets specifications even with the relatively low ENOB encountered with low output range usage. Accordingly, when the output range is relatively large, for example, when the AGC is performing correctly, then there is an excess of ENOB than can be trimmed down to save power. But when the output range is relatively small, then the input range must also be relatively small, which means that more of the ENOB of the ADC 402 should be used.

Figure 8:
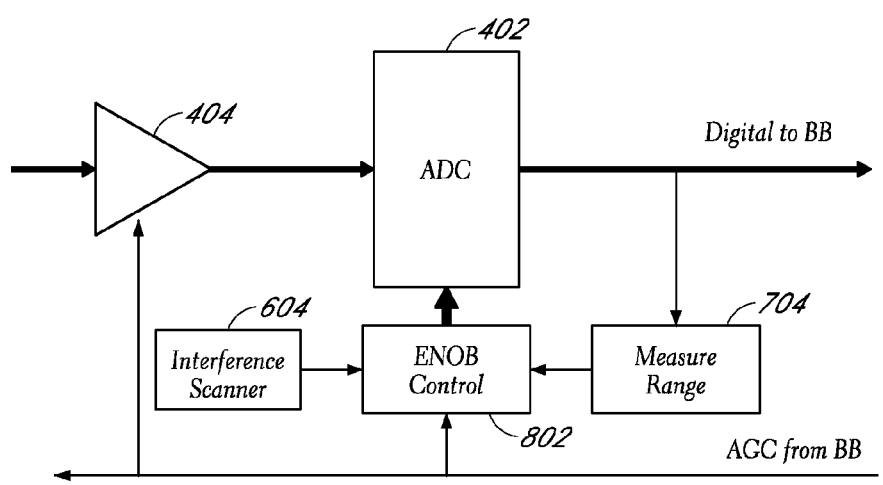
FIG. 8 illustrates an embodiment of the invention in which adjustment of an ENOB of an ADC is based on input (RF) signal power, interfering signal power, and signal level of the input to the ADC.

FIG. 8 illustrates an embodiment of the invention in which adjustment of an ENOB of the ADC 402 by the ENOB control 802 is based on input (RF) signal power, interfering signal power, and signal level of the input to the ADC 402.

The various embodiments can be implemented in a variety of ways. The ENOB control 406, 602, 702, 802 (FIGS. 4, 6, 7, and 8) can be implemented by hardware, by software/firmware, or by a combination of both hardware and software/firmware.

Figure 9:
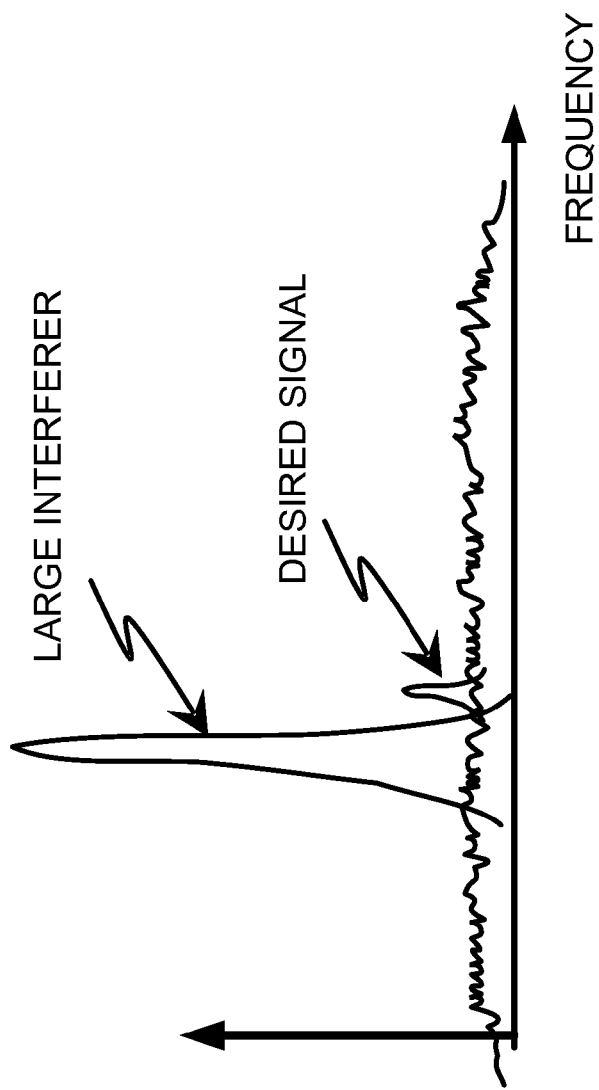
FIG. 9 illustrates an example of a spectrum of a received signal.
Figure 10:
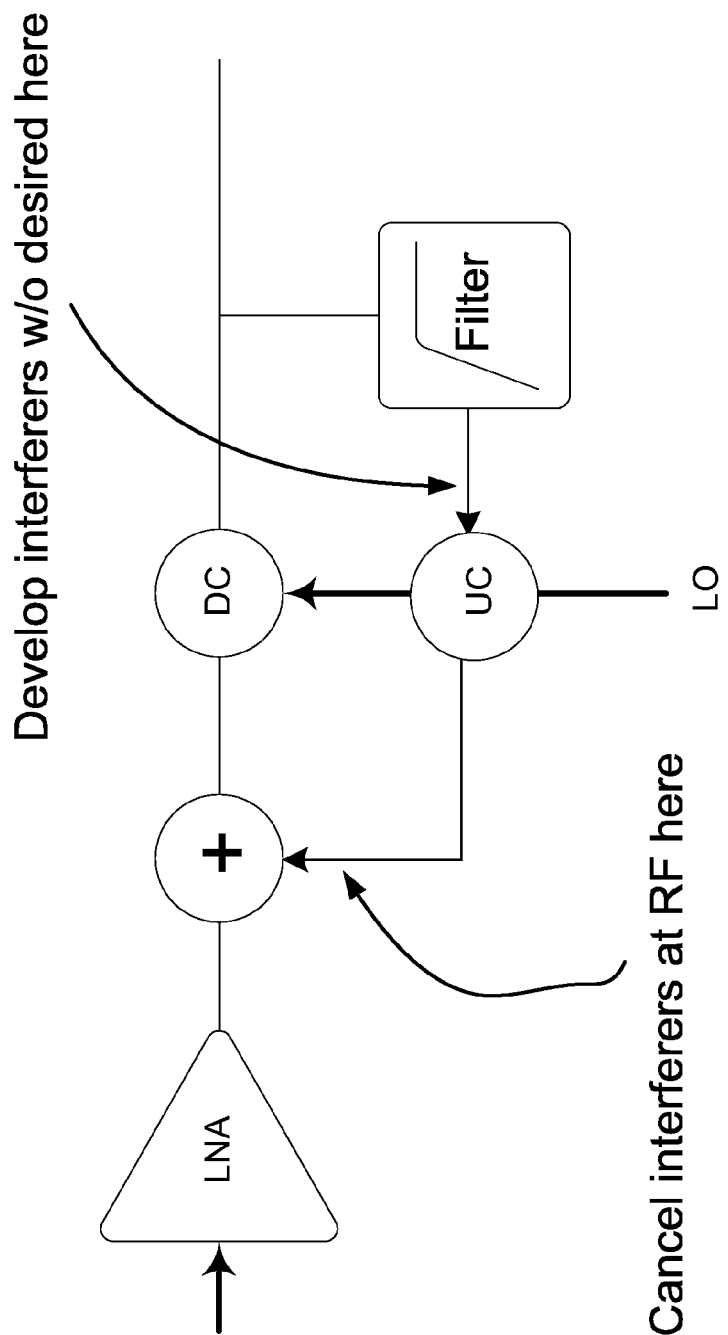
FIG. 10 illustrates an example of a prior art system.

To adequately receive the desired signal in the presence of a large interferer as shown in FIG. 9, a designer is typically faced with one of two choices: (1) increase the linearity and baseband filtering requirements of the radio; or (2) notch out the interferer earlier in the chain, at radio frequency, and relax the linearity and baseband filtering requirements of the radio. Choice 1 is a typical conventional approach.

Choice 2 uses a relatively high precision center frequency and a relatively high Q notch filter. For example, the desired and interfering signals may be separated by as little as a few MHz. An example of a ratio of carrier frequency to center frequency or filter transition band is expressed in Equation 4.

$$\frac{F_{separation}}{F_{carrier}} = \frac{5 \text{ MHz}}{3.5 \text{ GHz}} \approx 0.1\% \qquad \text{Equation 4}$$

Equation 4 illustrates that the ratio of filter frequencies to carrier frequency is relatively small. The high-Q nature of the filter may be managed using a resonating tank circuit, but the center frequency precision will typically be controlled with an active control loop. An applicable high-Q filter will be readily determined by one of ordinary skill in the art.

Figure 11:
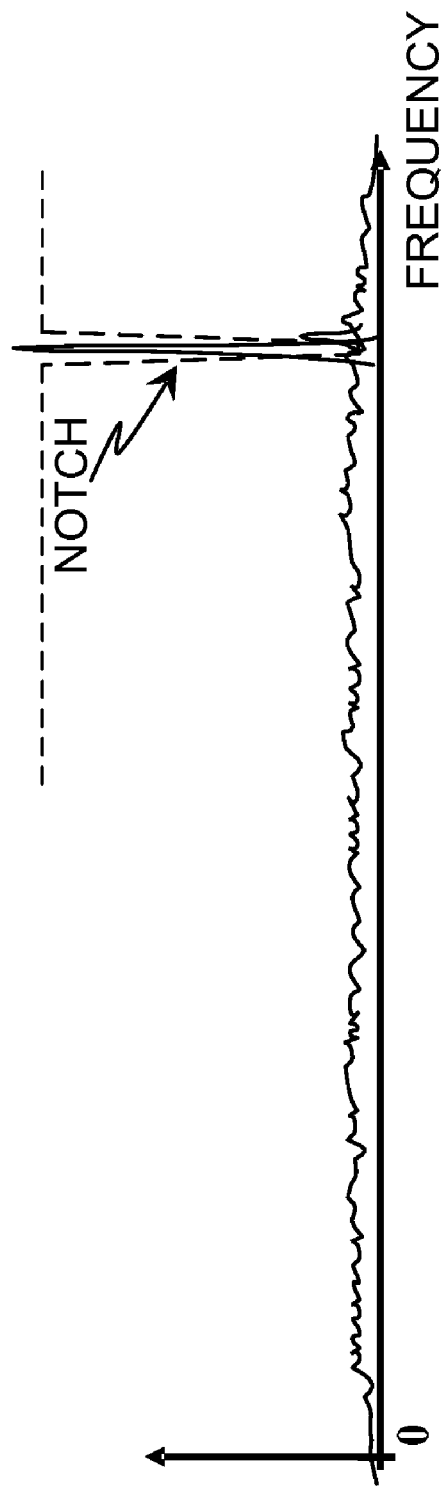
FIG. 11 illustrates signals and a notch.

FIG. 11 illustrates signals and a notch, with the chart extending to DC (0 frequency). The interferer location and strength can be assessed by an interference scanner, which will described in further detail later. In one embodiment, the effectiveness of notch filtering is assessed by the interference scanner.

Typically, the active control loop of the high-Q filter will use an estimate of the center frequency of the interferer. Techniques to estimate the center frequency will now be described.

Figure 12:
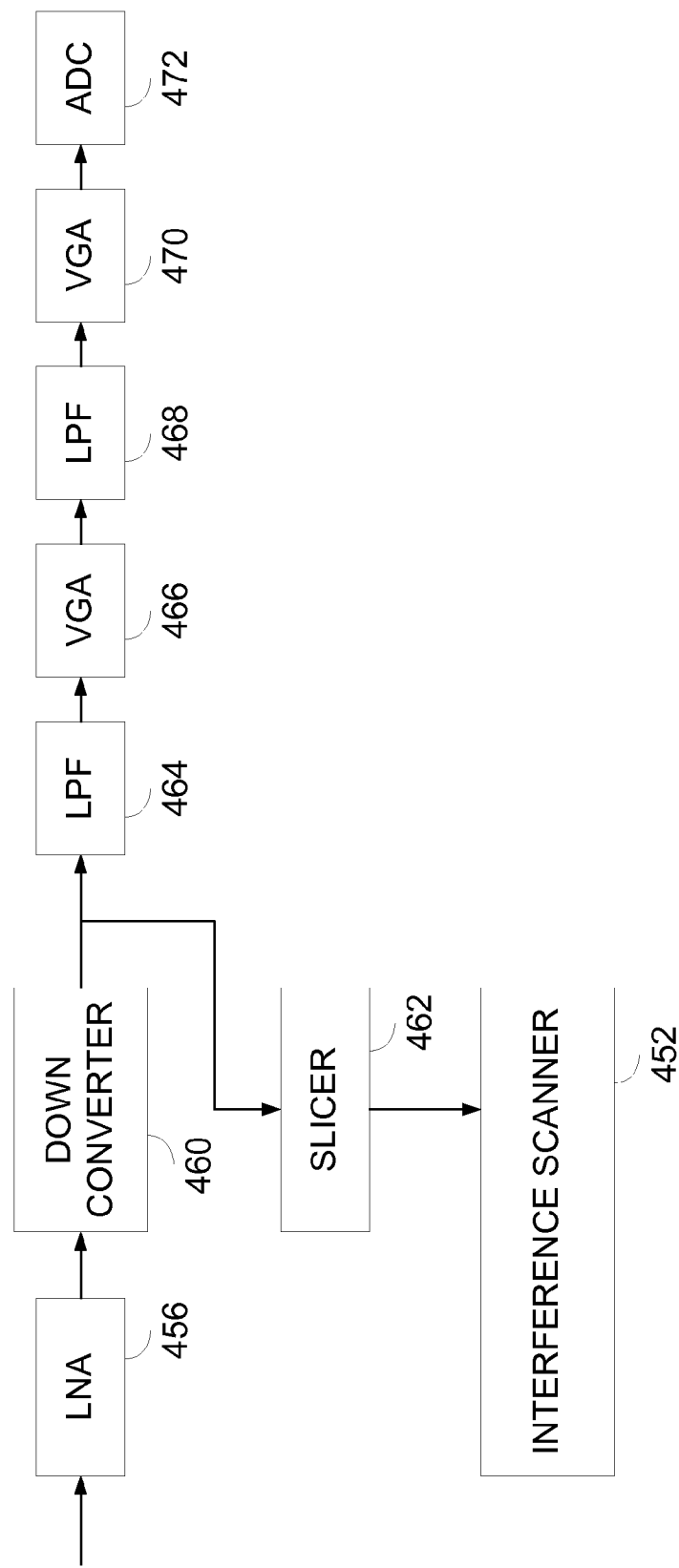
FIG. 12 illustrates a top-level architecture a front-end of a receiver using an interference scanner in an adaptive interference cancellation block.

FIG. 12 illustrates a top-level architecture a front-end of a receiver using an interference scanner 452. Note that interferers at RF appear as high frequency signals at baseband, as shown in FIG. 13.

RF signals, including the desired signal and one or more interferers, are received by a low-noise amplifier (LNA) 456. The RF signals from the LNA 456 are converted to baseband by a down converter 460.

An output of the down converter 460 is provided to a slicer 462 and to other components 464, 466, 468, 470, 472 of the receiver front-end. In the illustrated embodiment, the slicer 462 samples the output of the down converter 460 and determines whether the output is positive or negative. For example, the slicer 462 can generate hard symbols of zero or one from the output of the down converter 460. The output of the slicer 462 is provided to the interference scanner 452. The interference scanner 452 will be described later in greater detail. The other components 464, 466, 468, 470, 472 can be arranged in a variety of ways, including, but not limited to, conventional ways.

Figure 13:
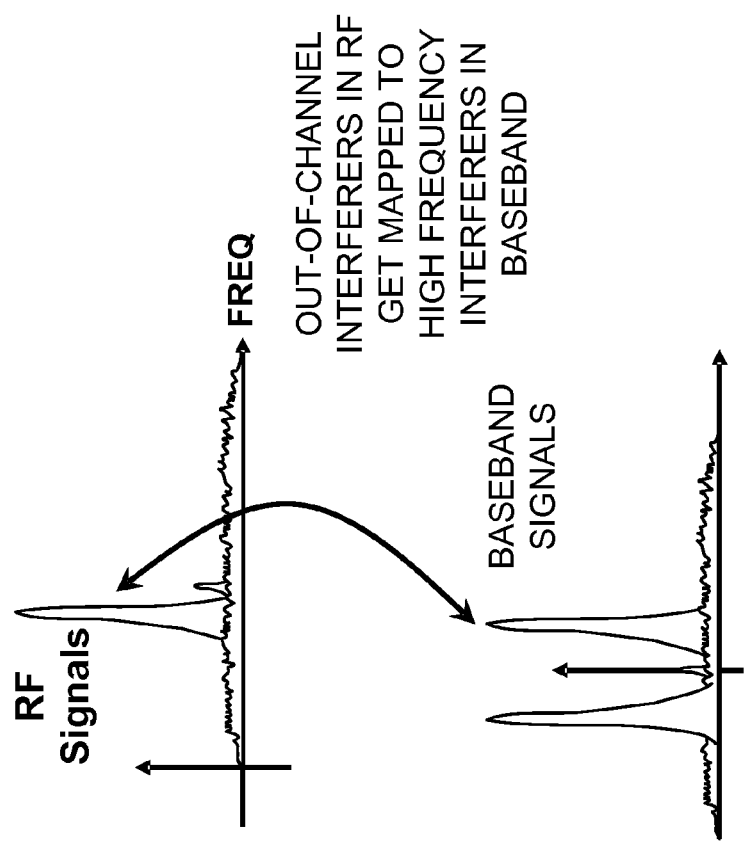
FIG. 13 illustrates an interferer originally in RF and mapped to baseband.

With reference to FIG. 13, interferers appear as high-frequency baseband signals. The probability of a zero-crossing per unit time from the output of the slicer 462 (FIG. 12) increases as the strength and frequency of the interferer increases. The output of the slicer 462 (FIG. 12) can be used to determine the zero-crossing of the down-converted signal; therefore shorter runs of ones or zeroes should be expected as the frequency of the interferer increases. For example, counters can be used to count the length of runs of ones or zeroes from the output of the slicer 462 (FIG. 12).

Figure 14:
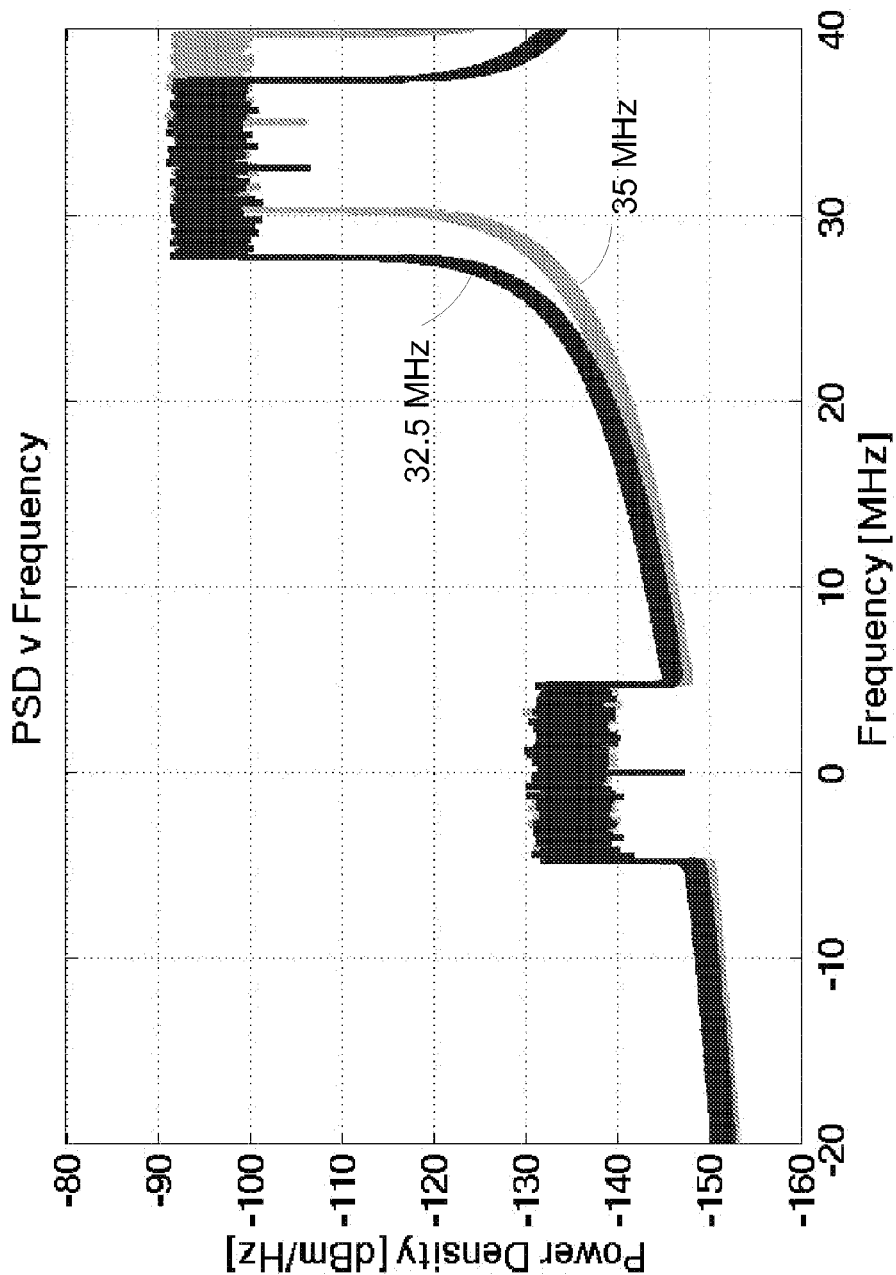
FIG. 14 is an overlay of two spectra with interferers in slightly different locations (32.5 MHz and 35 MHz frequency offsets).

Consider two cases: one in which an interferer is 3.25*BWdes away from the desired signal, and another in which an interferer is 3.5*BWdes away, wherein BWdes is the bandwidth of the desired signal. For this example, the bandwidth BWdes=10 MHz, so the interferers are at 32.5 MHz and 35 MHz frequency offsets. The spectra of the two cases are shown in FIG. 14.

Figure 15:
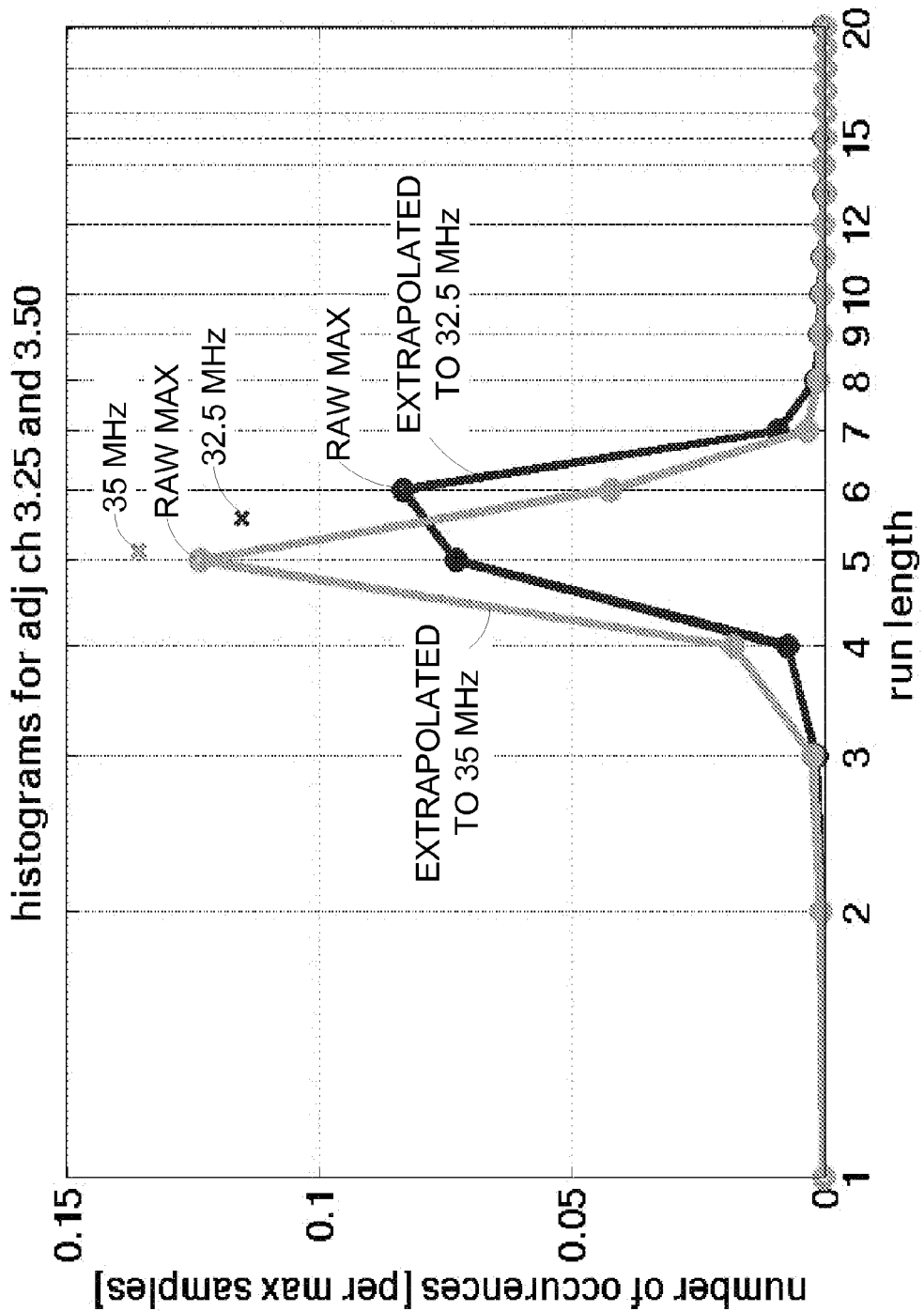
FIG. 15 is an overlay of two histograms of run-lengths of slicer output for two different interferer signals.
Figure 16:
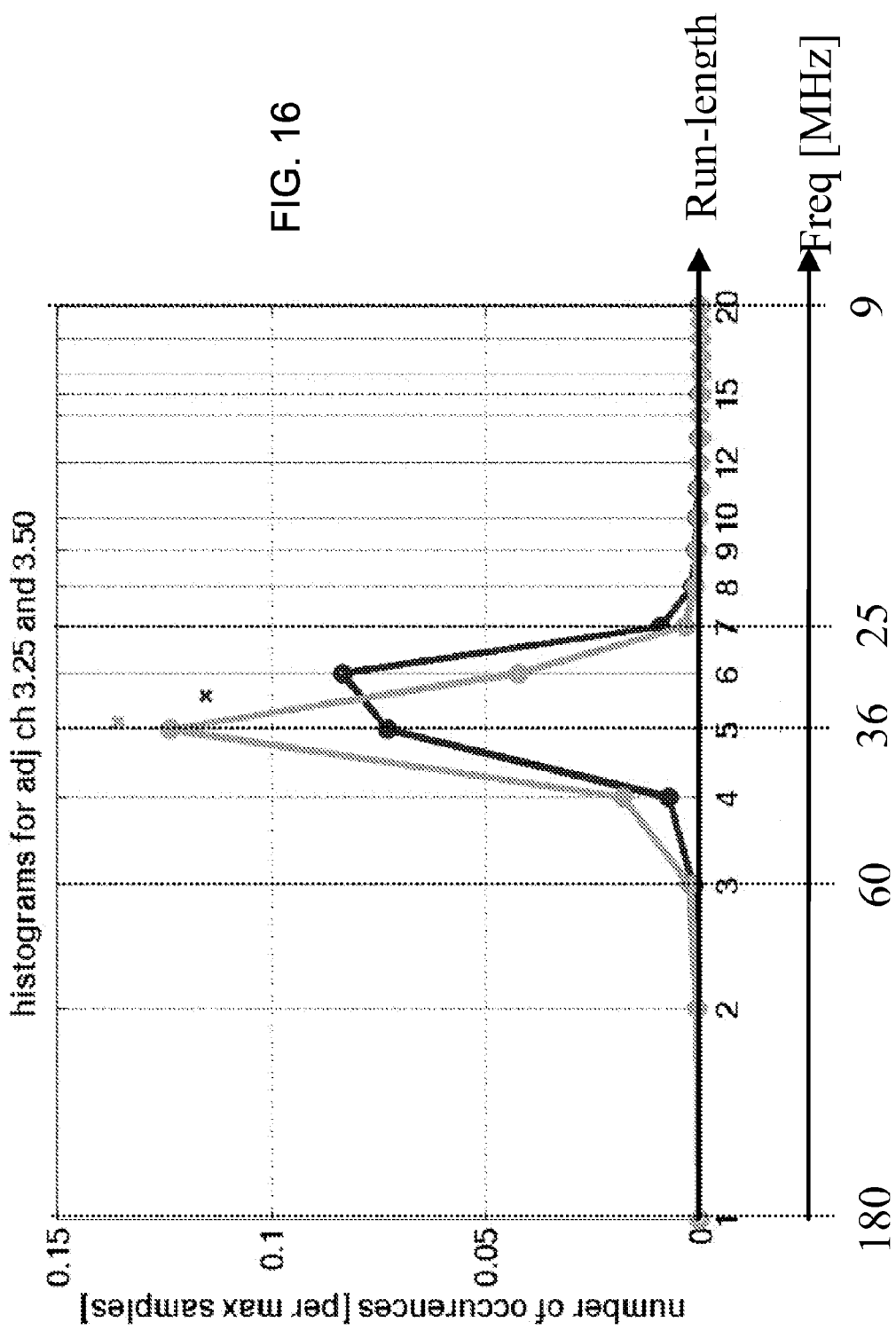
FIG. 16 illustrates a relationship of run-length to frequency.

A histogram of run-lengths from the output of the slicer 462 (FIG. 12) for these two cases (32.5 and 35) are overlaid and shown in FIG. 15. The histogram represents frequency of occurrence distribution of run-lengths encountered. Note that the peak occurrence run-length falls at run-length 5 for the interferer at 35 MHz frequency offset, and at run length 6 for the interferer at 32.5 MHz frequency offset. To clarify, peak occurrence run-length means the run-length value with the highest frequency of occurrence in the frequency distribution and not the maximum length of the runs of zeroes and/or ones encountered.

This data represented in the histogram raises 2 questions: (1) what is the relationship of run-length to interferer center frequency; and (2) run-lengths are discrete counts (natural number counts), but the interferer center frequency can be any frequency.

In one embodiment, equation 6 is used to convert a run-length to a signal frequency.

$$F_{runlength} = \frac{F_{samp}/2}{RL} \quad \text{Equation 6}$$

In Equation 6, $F_{runlength}$ is the frequency of the interferer, $F_{samp}$ is the sampling frequency of the slicer 412 (FIG. 12), and RL is the count of the run length (count of consecutive ones or consecutive zeroes). Using Equation 6, the run-length axis can be associated with frequency, as shown in FIG. 14. The run-length (x-axis value) with the peak frequency of occurrence can be used to estimate a frequency of the interfering signal. Alternatively or in addition to the foregoing, an estimate of a signal strength of the interfering signal relative to a signal strength of the desired signal can be determined by examination of the value of the peak frequency of occurrence (y-axis). The estimated interfering signal strength can be used to determine whether to activate an interference filter, to assess the effectiveness of a particular interference filter configuration, to determine whether to adjust or tune an interference filter, or the like.

The run-lengths RL are of course discrete counts. For example, there cannot be a peak run length of 5.3 counts. The peak run length will be a discrete count, such as 5 or 6 counts in the illustrated example. However, data other than just the peak run length can also be used to evaluate a frequency of the interferer or a magnitude of the interferer. This other data is represented by the shape of the histogram. For example, points that are near the maximum frequency of occurrence run length can be used to estimate where the peak occurrence for run-length would have fallen if there had been a continuous run-length axis or a finer resolution count (faster sampling rate), that is, a non-natural number peak run-length. Techniques can also estimate where on the y-axis the maximum run-length would have fallen.

In the illustrate embodiment, the following Matlab® function can be used to estimate the continuous coordinates of the run-length with the maximum number of occurrences.

```
function [xmax,ymax] = findPeak(rls,fsamp);
%-- estimates the continuous co-ordinates of the maximum run-length
%-- and converts the maximum run-length to frequency
%-- inputs:
%-- rls == histogram of run-lengths
%-- fsamp == slicer sampling frequency
%-- outputs:
%-- xmax == maximum run-length, converted to frequency of
maximum interferer
%-- ymax == number of occurrences of maximum run-length
%-- get max rl and neighbors
mp = find(rls==max(rls));
if (mp==1 | mp==length(rls));
        xmax = fsamp/2/mp;
        ymax = max(rls);
else
        vec = rls(mp-1:1:mp+1);
        xn = mp-1; yn=vec(1);
        xp = mp; yp=vec(2);
        xb = mp+1; yb=vec(3);
        if (vec(1)<=vec(3))
                xpeak = (xn*yb - xp*yb + xb*yn + xp*yn - xb*yp -
                    xn*yp)/(2*yn - 2*yp);
                ymax = (xpeak-xn)*(yp-yn)/(xp-xn) + yn;
        else
                xpeak = (xn*yb + xp*yb + xb*yn - xp*yn - xb*yp -
                    xn*yp)/(2*yb - 2*yp);
                ymax = (xpeak-xb)*(yb-yp)/(xb-xp) + yb;
        end;
        xmax = fsamp/2/xpeak;
end;
```

The above algorithm performs a linear extrapolation around the "raw" or discrete max to estimate an extrapolated max value. While the term extrapolation is used, the estimated data is within the run-length of the data (x-axis), but is outside the domain of the counted frequency of occurrence data (y-axis). The illustrated Matlab® function assumes that the peak is shaped like a simple "triangle" near the raw maximum (discrete count maximum). Visually, the algorithm can be observed in the graph of FIG. 15 by extrapolating the lines near the maximum of the two curves. The extrapolated data is represented by two "x" marks on the graph. The extrapolated peak is calculated to lie on a line that is formed by the raw maximum point and the nearest neighbor point that is farthest away from it, such as the adjacent point that has the lower count.

For example, the points with run lengths 6 (maximum) and 7 (adjacent with lower count) are used for the curve that is extrapolated to a 32.5 MHz peak. For example, the points with run lengths 4 (maximum) and 5 (adjacent with lower count) are used for the curve that is extrapolated to a 35 MHz peak. The extrapolated peak is determined to be located at the intersection of said line and another line formed by negating the slope (changing the sign of the slope) of said line and passing said line through the nearest neighbor point that is closest to the maximum, such as the other adjacent point (point at run length 5 for the 32.5 MHz peak and the point at run length 6 for the 35 MHz peak). The foregoing illustrates that the extrapolated x-axis value (non-natural number run length) can be used to estimate a frequency of the interfering signal.

In addition, alternatively or in addition to the foregoing, an estimate of a signal strength of the interfering signal relative to a signal strength of the desired signal can be determined by examination of the magnitude of the extrapolated peak (y-axis). The estimated interfering signal strength can be used to determine whether to activate an interference filter, to assess the effectiveness of a particular interference filter configuration, to determine whether to adjust or tune an interference filter, or the like.

The foregoing algorithm can be implemented via hardware, firmware, software, or by a combination of the foregoing. For example, a microprocessor, microcontroller, or other processor can be used to assess the interferer frequency. Using such techniques, such as the foregoing algorithm, the coordinates of the peak of the interferer, which for the example of FIG. 15, is shown below in FIG. 16. The frequency for the interferer as mapped in baseband versus run length count is expressed along a second horizontal axis of FIG. 16. A frequency associated with a local oscillator for the downconverter can be used to remap the baseband frequency of the interferer back to radio frequency. In many systems, the frequency of the local oscillator can change depending on the channel that is desired to be received. The interferer frequency at radio frequency can be the local oscillator frequency plus or minus the interferer frequency assessed at baseband.

The analysis of the run-lengths of the sign (positive or negative) of a signal can be used as a crude estimate of the spectrum of arbitrary signals, after the run-lengths are converted to frequencies, according to Equation 6. This analysis, illustrated with the aid of the histogram, should be limited to spectra with relatively few dominant peaks.

One application of the invention is in the field of wireless radio receivers; however, the interference scanner can be used for spectrum estimation for arbitrary signals.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
    an analog-to-digital converter (ADC) configured to convert an analog baseband signal of a radio frequency (RF) receiver from analog to digital, wherein an effective number of bits (ENOB) of the ADC is controllable; and
    an ENOB control circuit in communication with the ADC, wherein the ENOB control circuit is responsive to at least one control input, wherein the ENOB control circuit is configured to adaptively control the ENOB of the analog-to-digital converter (ADC) in response to the at least one control input;
    wherein the at least one control input comprises one or more of a level of automatic gain control of the RF receiver, a level of the output range of the ADC, or an amount of interference;
    wherein the ADC comprises a pipelined ADC, wherein the ENOB control circuit is further configured to adaptively control the effective number of bits of the ADC by control of a settling time of the pipelined ADC, wherein the settling time is associated with at least one switched-capacitor op-amp stage of the pipelined ADC.

2. The apparatus of claim 1, wherein the ENOB control circuit is further configured to adaptively control the ENOB such that the controlled ENOB is lower when the indication of the level of automatic gain control indicates higher gain, and the controlled ENOB is higher when the indication of the level of automatic gain control indicates lower gain.

3. The apparatus of claim 1, wherein the apparatus comprises a transceiver.

4. The apparatus of claim 1, wherein the apparatus comprises a wireless, battery-operated transceiver.

5. The apparatus of claim 1, further comprising an interference scanner configured to determine the amount of interference that is present in an RF signal associated with the analog baseband signal, and wherein the ENOB control circuit is further configured to adaptively control the ENOB based on the level of automatic gain control and the amount of interference.

6. The apparatus of claim 1, further comprising an interference scanner configured to determine an amount of interference that is present in an RF signal corresponding to the analog baseband signal, and wherein the ENOB control circuit is further configured to adaptively control the ENOB based only on the amount of interference.

7. The apparatus of claim 1, further comprising:
    a range measurement circuit configured to determine the output range used by the ADC;
    wherein the ENOB control circuit is configured to receive an indication of a level of the output range and to adaptively control the ENOB of the ADC based only on the determined output range level.

8. The apparatus of claim 1, wherein the ENOB control circuit is configured to adaptively control the ENOB based on the determined output range and on the level of automatic gain control for an RF signal associated with the analog baseband signal.

9. The apparatus of claim 1, wherein the ENOB control circuit is configured to adaptively control the ENOB based only on the level of automatic gain control of the RF receiver.

10. The apparatus of claim 1, further comprising:
    an interference scanner configured to determine an amount of interference that is present in an RF signal associated with the analog baseband signal; and
    wherein the ENOB control circuit is configured to adaptively control the ENOB based only on the level of automatic gain control for an RF signal associated with the analog baseband signal and the amount of interference.

11. A method of dynamically adjusting an analog-to-digital converter (ADC) of a radio frequency (RF) receiver, the method comprising:
    converting an analog baseband signal of the RF receiver from analog to digital with the ADC; and
    adaptively controlling an effective number of bits (ENOB) characteristic of the ADC for conversion of the analog baseband signal based at least partly on one or more of the level of automatic gain control, a level of the output range of the ADC, or an amount of interference;

wherein the ADC comprises a pipelined ADC, wherein adaptively controlling further comprises adjusting a settling time of the pipelined ADC, wherein the settling time is associated with at least one switched-capacitor op-amp stage of the pipelined ADC.

12. The method of claim 11, further comprising adaptively controlling the ENOB such that the controlled ENOB is lower when the indication of the level of automatic gain control indicates higher gain, and the controlled ENOB is higher when the indication of the level of automatic gain control indicates lower gain.

13. The method of claim 11, wherein the RF receiver is embodied in a transceiver.

14. The method of claim 11, wherein the RF receiver is embodied in a wireless, battery-operated transceiver.

15. The method of claim 11, further comprising determining the amount of interference that is present in an RF signal associated with the analog baseband signal, and adaptively controlling the ENOB based on the level of automatic gain control and the amount of interference.

16. The method of claim 11, further comprising determining the amount of interference that is present in an RF signal corresponding to the analog baseband signal, and adaptively controlling the ENOB based only on the amount of interference.

17. The method of claim 11, further comprising:
determining the output range used by the ADC to convert the analog baseband signal from analog to digital; and
adaptively controlling an effective number of bits (ENOB) for conversion based only on the determined output range.

18. The method of claim 11, wherein adaptively controlling further comprises adjusting a settling time of the ADC.

19. The method of claim 11, further comprising adaptively controlling the ENOB based on the determined output range and on the level of automatic gain control for an RF signal associated with the analog baseband signal.

20. The method of claim 11, further comprising adaptively controlling the ENOB based only on the level of automatic gain control for an RF signal associated with the analog baseband signal.

21. The method of claim 11, further comprising:
determining an amount of interference that is present in an RF signal corresponding to the analog baseband signal; and
adaptively controlling the ENOB based on the determined output range, on the level of automatic gain control for an RF signal associated with the analog baseband signal, and the amount of interference.

22. An apparatus comprising:
an analog-to-digital converter (ADC) configured to convert an analog baseband signal of a radio frequency (RF) receiver from analog to digital, wherein an effective number of bits (ENOB) of the ADC is controllable; and
an ENOB control circuit in communication with the ADC, wherein the ENOB control circuit is responsive to at least one control input, wherein the ENOB control circuit is configured to adaptively control the ENOB of the analog-to-digital converter (ADC) in response to the at least one control input;
wherein the at least one control input comprises one or more of a level of automatic gain control of the RF receiver, a level of the output range of the ADC, or an amount of interference;
wherein the ADC comprises a pipelined ADC, wherein the ENOB control circuit is further configured to adaptively control the effective number of bits of the ADC by at least one of control of a settling time of the ADC or selective activation of one or more stages of the pipelined ADC, wherein the settling time is associated with at least one switched-capacitor op-amp stage of the pipelined ADC.

23. A method of dynamically adjusting an analog-to-digital converter (ADC) of a radio frequency (RF) receiver, the method comprising:
converting an analog baseband signal of the RF receiver from analog to digital with the ADC; and
adaptively controlling an effective number of bits (ENOB) characteristic of the ADC for conversion of the analog baseband signal based at least partly on one or more of the level of automatic gain control, a level of the output range of the ADC, or an amount of interference;
wherein the ADC comprises a pipelined ADC, wherein adaptively controlling further comprises adjusting a settling time of the pipelined ADC or selective activation of one or more stages of the pipelined ADC, wherein the settling time is associated with at least one switched-capacitor op-amp stage of the pipelined ADC.

* * * * *